US008680466B2

(12) United States Patent
Kanno et al.

(10) Patent No.: US 8,680,466 B2
(45) Date of Patent: Mar. 25, 2014

(54) ELECTRON MICROSCOPE, AND SPECIMEN HOLDING METHOD

(75) Inventors: Seiichiro Kanno, Iwaki (JP); Hiroyuki Kitsunai, Kasumigaura (JP); Masaru Matsushima, Hitachinaka (JP); Toru Shuto, Naka (JP); Kazuyuki Ikenaga, Tachikawa (JP)

(73) Assignee: Hitachi High-Technologies Coporation, Tokyo (JP)

( * ) Notice: Subject to any disclaimer, the term of this patent is extended or adjusted under 35 U.S.C. 154(b) by 126 days.

(21) Appl. No.: 13/202,556

(22) PCT Filed: Oct. 15, 2009

(86) PCT No.: PCT/JP2009/005375
§ 371 (c)(1),
(2), (4) Date: Aug. 19, 2011

(87) PCT Pub. No.: WO2010/097858
PCT Pub. Date: Sep. 2, 2010

(65) Prior Publication Data
US 2011/0303844 A1  Dec. 15, 2011

(30) Foreign Application Priority Data
Feb. 27, 2009  (JP) .................................. 2009-045041

(51) Int. Cl.
*H01J 37/28* (2006.01)
(52) U.S. Cl.
USPC ............................ 250/310; 250/311; 250/306
(58) Field of Classification Search
USPC ................ 250/311, 306, 310, 440.11, 442.11
See application file for complete search history.

(56) References Cited

U.S. PATENT DOCUMENTS

| 6,232,787 B1 * | 5/2001 | Lo et al. .................... 324/754.22 |
| 6,914,441 B2 * | 7/2005 | Talbot et al. ............. 324/754.23 |
| 7,049,585 B2 * | 5/2006 | Nakasuji et al. .............. 250/310 |
| 7,109,484 B2 * | 9/2006 | Nakasuji et al. .............. 250/310 |
| 7,763,863 B2 * | 7/2010 | Mizuochi et al. ........ 250/440.11 |
| 7,919,760 B2 * | 4/2011 | Jau et al. .................. 250/442.11 |

(Continued)

FOREIGN PATENT DOCUMENTS

| JP | 2002-252275 | 9/2002 |
| JP | 2006-013049 | 1/2006 |
| WO | WO 2006/093268 A1 | 9/2006 |

*Primary Examiner* — Nikita Wells
*Assistant Examiner* — Johnnie L Smith
(74) *Attorney, Agent, or Firm* — McDermott Will & Emery LLP (57) ABSTRACT

It is an object of the present invention to provide an electron microscope for properly applying a retarding voltage to a sample which is brought into electrical conduction.
In order to accomplish the above-described object, the following electron microscope is proposed: The electron microscope including a negative-voltage applying power-supply for applying the negative voltage to the sample, and thereby forming a decelerating electric field to be exerted onto the electron beam, an electrostatic-chuck mechanism for providing a potential difference among a plurality of its internal electrodes, and thereby generating an adsorption force to be exerted onto the sample, and a contact terminal which is so configured as to come into contact with the sample when the sample is deployed on a sample-supporting stage, the electrostatic-chuck mechanism causes the potential difference to occur among the internal electrodes in the state where the contact terminal comes into contact with the sample, the negative-voltage applying power-supply being operated to apply the negative voltage to the contact terminal after the potential difference has been caused to occur.

10 Claims, 7 Drawing Sheets

(56) References Cited

U.S. PATENT DOCUMENTS

| | | | |
|---|---|---|---|
| 8,232,522 B2* | 7/2012 | Miya et al. | 250/306 |
| 8,389,935 B2* | 3/2013 | Fukuda et al. | 250/306 |
| 2002/0036264 A1* | 3/2002 | Nakasuji et al. | 250/306 |
| 2008/0302963 A1* | 12/2008 | Nakasuji et al. | 250/310 |
| 2009/0212213 A1* | 8/2009 | Nakasuji et al. | 250/310 |
| 2012/0261589 A1* | 10/2012 | Miya et al. | 250/442.11 |

* cited by examiner

ELECTRON MICROSCOPE, AND SPECIMEN HOLDING METHOD

RELATED APPLICATIONS

This application is the U.S. National Phase under 35 U.S.C. §371 of International Application No. PCT/JP2009/005375, filed on Oct. 15, 2009, which in turn claims the benefit of Japanese Application No. 2009-045041, filed on Feb. 27, 2009, the disclosures of which Applications are incorporated by reference herein.

TECHNICAL FIELD

The present invention relates to a measurement apparatus and an inspection apparatus for performing the line-width measurement or defect measurement of a semiconductor device by taking advantage of an electron beam.

BACKGROUND ART

In recent years, an electron microscope has been applied to the dimension measurement or defect inspection of a semiconductor-device pattern. The electron microscope is an apparatus for detecting electrons which are obtained by irradiating the sample with a narrowly-focused electron beam. By doing this, the electron microscope performs formation of the sample's image, or the dimension measurement or defect inspection of the semiconductor-device pattern. In general, the electron beam whose accelerating energy is higher allows implementation of formation of the higher-resolution image. In contrast thereto, the higher-accelerating-energy electron beam, in some cases, gives rise to occurrence of the sample's electrification, or occurrence of damage to the sample. As a technique for solving mutually-contradictory problems like this, there exists the following retarding technology:

The retarding technology is the technique of applying a negatives voltage to the sample, and thereby forming, on the sample, a decelerating electric field to be exerted onto the electron beam. Namely, it turns out that the electron beam, which has passed through an objective lens while maintaining its higher accelerating energy, is decelerated immediately before the electron beam has attained the sample. According to the retarding technology for lowering the attainment energy to the sample in this way, it becomes possible to implement the compatibility between the high-resolution implementation of the image and supersession of the damage to the sample.

Meanwhile, of semiconductor devices, there exists a semiconductor device whose surface is covered with an insulating film such as an oxide film or nitride film. This covering with the insulating film, in some cases, makes it impossible to properly apply the retarding voltage to the semiconductor device. In response thereto, conventional technologies for bringing the insulating-film-covered sample into electrical conduction are explained in Patent Literature 1 and Patent Literature 2. In Patent Literature 1, a technique is explained which breaks through the insulating layer by pushing and pressing conduction pins onto the semiconductor wafer. In Patent Literature 2, a technique is explained which reduces the contact resistance between a ground electrode and the sample by clarifying the insulating film. Here, clarifying the insulating film is performed by flowing a leakage current from the ground electrode which is in contact with the sample.

CITATION LIST

Patent Literatures

Patent Literature 1: JP-A-2002-252275
Patent Literature 2: JP-A-2006-13049

SUMMARY OF INVENTION

Technical Problem

According to an electron-beam proximity light-exposure apparatus disclosed in Patent Literature 1, the following method is disclosed: Namely, there are provided the plurality of conduction pins whose front-ends are sharp, and which are capable of protruding/sinking from/into the adsorption surface of an electrostatic chuck for holding the wafer. This configuration is implemented in order to bring the wafer into the electrical conduction in a state where, when the mask pattern is transferred onto the wafer, the conduction pins do not become obstructions thereto. Also, the following method is disclosed: Namely, the electrical conduction between the wafer and the conduction pins is established with certainty by mechanically breaking through the insulating film with which the wafer is covered. This mechanical breaking-through of the insulating film is implemented by providing an elastic member which is attached in the protruding direction of the conduction pins, and a driving mechanism which is capable of vibrating the conduction pins at a high speed in the right and left directions.

Meanwhile, according to the grounding mechanism for the mask and wafer of an electron-beam exposure apparatus disclosed in Patent Literature 2, the following method is disclosed: Namely, the contact resistance is lowered by clarifying (i.e., purging) the insulating film. Here, clarifying the insulating film is performed by bringing the ground electrode, whose front-end is not sharp, into contact with the wafer, and applying a voltage to the ground electrode thereby to flow a surface-activating current. Also, clarifying the insulating film is performed in order to establish the grounding with certainty while suppressing an increase in the number of rear-surface foreign substances caused by the contact between the ground electrode and the wafer. Also, the following configuration is disclosed: Namely, in order to establish the electrical conduction with certainty, the surface-activating current and the voltage applied to the ground electrode are measured alternately. In this way, the applied voltage is adjusted until a sufficient surface-activating current is flown. At this time, the polarity of the applied voltage is made opposite to the polarity of a voltage to be applied to the electrostatic chuck for holding the wafer. This configuration prevents the adsorption force from being lowered.

According to the techniques disclosed in Patent Literature 1 and Patent Literature 2, it is possible to establish the electrical conduction between the grounding potential and the sample. No explanation, however, has been given regarding the proper application of the retarding voltage to the sample.

Hereinafter, the explanation will be given below concerning an electron microscope whose object is to properly apply the retarding voltage to a sample which is brought into the electrical conduction.

Solution to Problem

In order to accomplish the above-described object, the following electron microscope is proposed: A scanning electron microscope for scanning an electron beam on a sample deployed on a sample-supporting stage, the electron beam being emitted from an electron source, the scanning electron microscope including a negative-voltage applying power-supply for applying a negative voltage to the sample, and thereby forming a decelerating electric field to be exerted onto the electron beam, an electrostatic-chuck mechanism for providing a potential difference among a plurality of its internal electrodes, and thereby generating an adsorption force to be exerted onto the sample, and a contact terminal which is so configured as to come into contact with the sample when the sample is deployed on the sample-supporting stage, wherein the electrostatic-chuck mechanism causes the potential difference to occur among the internal electrodes in the state where the contact terminal comes into contact with the sample, the negative-voltage applying power-supply being operated to apply the negative voltage to the contact terminal after the potential difference has been caused to occur.

Advantageous Effects of Invention

The potential difference is caused to occur among the plurality of electrodes included in the above-described electrostatic-chuck mechanism. Then, this potential difference allows establishment and implementation of the electrical conduction between the contact terminal and the sample. As a result, by applying the negative voltage to the sample in this electrical-conduction state, it becomes possible to stably apply the negative voltage to the sample regardless of the presence of such factors as an insulating film.

DESCRIPTION OF EMBODIMENTS

For example, a critical-dimension SEM (which, hereinafter, will be referred to as "CD-SEM"), i.e., one type of scanning electron microscope (: SEM), is used for the measurement on the gate dimension of a semiconductor device. Also, a defect-inspection SEM is used for the defect inspection. Also, utilization of the potential contrast has made it more and more common to use a scanning electron microscope for the electrical-conduction inspection of a wiring deep hole.

Selecting the CD-SEM as its one example, the brief explanation will be given below concerning the fundamental principle of the measurement made by the CD-SEM. Basically, the measurement principle of the CD-SEM is the same as that of a scanning electron microscope. Namely, first, primary electrons are emitted from an electron gun, then being accelerated by applying voltage thereto. After that, the beam diameter of the electron beam is narrowly focused by an electromagnetic lens. This electron beam is scanned onto a sample such as a semiconductor wafer in a two-dimensional manner. Moreover, secondary electrons are generated as a result of the scanned electron beam's having entered the sample. Finally, the secondary electrons are detected by a detector.

The intensity of these secondary electrons reflects the profile of the sample's surface. Then, the scanning of the electron beam and the detection of the secondary electrons are displayed on a monitor in a manner of being synchronized with each other. As a result of the reflection of the profile of the sample's surface, this display allows implementation of the image-formation of a microminiaturized pattern on the sample. In the CD-SEM, when measuring, e.g., the line width of a gate electrode, the dimension of the gate electrode is derived by distinguishing and judging an edge of the pattern on the basis of a change in the light-and-dark of the image obtained. The explanation given so far is the measurement principle of the CD-SEM.

In a scanning electron microscope, the use of the electron beam makes it possible to analyze a pattern or defect with an exceedingly high resolution. Nevertheless, there also exist problems which are caused to occur by the very use of the electron beam. One of these problems is the problem of sample's electrification. Namely, the generation efficiency of the secondary electrons depends on the accelerating energy of the primary electrons which will enter the sample. Concretely, when the incoming energy is comparatively high, the secondary-electron generation efficiency becomes smaller than 1. Accordingly, if the insulating property of the sample is high, the sample's surface becomes negatively electrified. When the sample is becoming electrified during the measurement in this way, the resultant electrification gives rise to the occurrence of an image distortion or a contrast change. Also, of materials which are supposed to become measurement targets, there exists a material which is subjected to damage by the irradiation with the high-incoming-energy electron beam. This phenomenon also becomes another problem. In order to prevent these problems, it is advantageous to lower the incoming energy down to the lowest-possible degree. In some cases, it is preferable to lower the accelerating energy down to 1 kV or less (an about 5-kV to 30-kV accelerating voltage is used in a common SEM).

Meanwhile, there exists the following problem: Namely, merely lowering the accelerating energy makes it impossible to sufficiently focus the diameter of the electron beam, thereby resulting in a lowering in the resolution. In view of this situation, the so-called retarding method is applied, which is as follows: Namely, the beam diameter is narrowly focused by accelerating the electron beam with the high accelerating voltage applied thereto. Moreover, the incoming energy of the electron beam is reduced by applying a decelerating voltage (i.e., retarding voltage) to the sample immediately before the electron beam enters the sample. This application of the retarding method makes it possible to implement the compatibility between implementation of the high-resolution analysis and prevention of the sample's electrification and damage.

As a method for applying the retarding voltage to the wafer, it is conceivable to apply the retarding voltage to the stage which mounts the wafer thereon. Namely, since the wafer usually comes into contact with the stage, the wafer is maintained at the same electric potential as that of the stage. Accordingly, applying the retarding voltage to the stage results in implementation of the application of the retarding voltage to the wafer.

In order to reduce the direct contact between the stage and the wafer, and thereby in order to reduce the number of foreign substances on the wafer's rear surface, consideration is given to a case where about three or four support pins are intervened between the stage and the wafer. In this case, the following processing is preferable: These support pins are formed of a conductive material, thereby maintaining these support pins at the same electric potential as that of the stage. Moreover, the retarding voltage to be applied to the stage is applied to these support pins.

In many cases, however, the surface of the wafer flowing along on an actual fabrication line is covered with an insulating thin film such as an oxide film or nitride film. At this time, merely mounting the wafer on the stage or support pins only results in the occurrence of electrical insulation caused by this insulating thin film. The occurrence of this electrical insulation makes it impossible to maintain the wafer at the retarding voltage, thereby preventing the wafer's electric potential from being stabilized.

Also, in recent years, it has become more and more common to use an electrostatic chuck as the stage. This is performed with an expectation that there will be an effect that the focus adjustment becomes easier by planarizing the wafer. Usually, the wafer-holding surface of the electrostatic chuck is covered with a high-insulating ceramics. Accordingly, merely mounting the wafer on the electrostatic chuck results in the occurrence of the electrification caused by the electron beam. This electrification makes it impossible to stabilize the wafer's electric potential.

Consequently, it becomes necessary to provide a terminal for maintaining the wafer's electric potential. In this case as well, however, the presence of the insulating film attached on the wafer's surface becomes the problem. Moreover, when the electrostatic chuck is used for the scanning electron microscope, if the electron beam which has entered the wafer remains there as remaining electric charges, these charges give rise to the occurrence of a remaining adsorption force. This remaining adsorption force is highly likely to become a cause for the transportation error. Accordingly, a special attention becomes necessary when the electrostatic chuck is used.

In embodiments which will be explained hereinafter, the explanation will be given concerning the following electrostatic-chuck mechanism, or a scanning electron microscope which mounts this electrostatic-chuck mechanism thereon: Namely, an electrostatic-chuck mechanism which makes it possible to ensure the electrical conduction to the sample such as a wafer, and to apply the retarding voltage to the sample in the state where the electrical conduction is ensured.

Simultaneously, the explanation will be given below regarding a sample-holding method used for a scanning electron microscope which allows the electrical conduction between a contact pin and a wafer to be established with certainty, and allows the sample to be observed while applying the retarding voltage to the wafer via the contact pin.

In an embodiment hereinafter, the explanation will be mainly given below concerning a scanning electron microscope for measuring the surface of a sample using an electron beam, wherein holding the sample is performed by an electrostatic chuck which includes a plurality of electrodes inside, a retarding voltage being applied to the sample via a contact pin, the contact pin being held by an elastic member such that the contact pin protrudes from the surface of the electrostatic chuck, DC voltages being applied to the plurality of electrodes of the electrostatic chuck before at least the irradiation with the electron beam is started, absolute values of the DC voltages being different from each other.

Also, as another embodiment, the explanation will be given below regarding a scanning electron microscope, wherein holding the sample is performed by an electrostatic chuck which includes a plurality of electrodes in its inside, at least a plurality of contact pins being provided, the contact pins being held by an elastic member such that the contact pins protrude from the surface of the electrostatic chuck, a retarding voltage being applied to at least one of the plurality of contact pins before the irradiation with the electron beam is started.

Also, as still another embodiment, the explanation will be given below concerning a sample-holding method at the time when the surface of a sample is measured using an electron beam while the sample is being held by an electrostatic chuck which includes a plurality of electrodes in its inside, the sample-holding method including the steps of bringing the sample into contact with a contact pin before the sample is irradiated with the electron beam, the contact pin being held by an elastic member such that the contact pin protrudes from the surface of the electrostatic chuck, applying DC voltages to the plurality of internal electrodes of the electrostatic chuck, absolute values of the DC voltages being different from each other, and applying a retarding voltage to at least the contact pin.

Also, the explanation will be given below regarding a sample-holding method including the steps of bringing a sample into contact with a plurality of contact pins before the sample is irradiated with an electron beam, the contact pins being held by an elastic member such that the contact pins protrude from the surface of the electrostatic chuck, and applying a retarding voltage to at least one of the contact pins.

According to the above-described embodiments, in the scanning electron microscopes, it becomes possible to make the measurement on the wafer's surface while holding the wafer in a planarized manner using the electrostatic chuck, and while maintaining the wafer's electric potential at the retarding voltage with certainty. Furthermore, it becomes possible to transport the wafer smoothly from the electrostatic chuck after the measurement. These features allow the measurement to be made with a high throughput implemented without resulting in the occurrence of an image distortion or a contrast change during the measurement, and with a high resolution implemented without giving rise to the occurrence of damage onto the sample's surface.

Hereinafter, referring to drawings, the explanation will be given below concerning a concrete example of the CD-SEM where the electrostatic-chuck mechanism and the retarding method are co-used.

Figure 5:
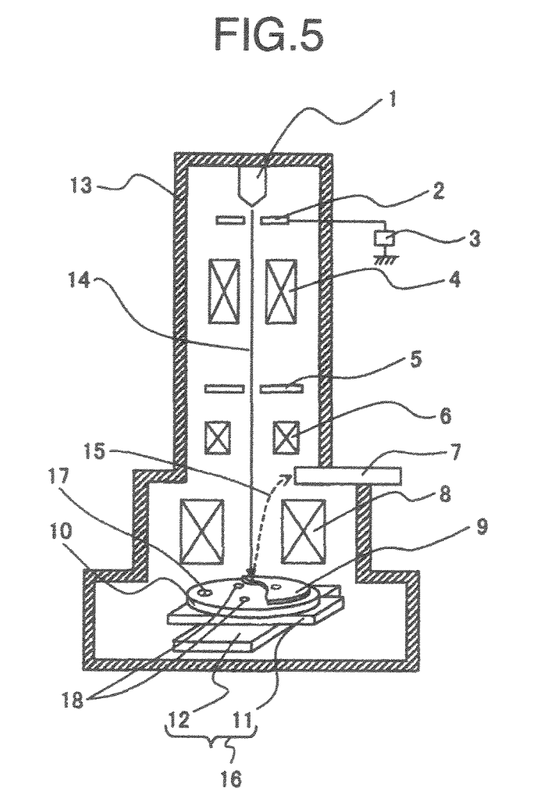
FIG. 5 is a schematic configuration diagram of the scanning electron microscope.

FIG. 5 illustrates a schematic configuration diagram of the CD-SEM. Primary electrons, which are emitted from an electron source 1, are accelerated by a primary-electron accelerating electrode 2. Here, a high voltage is applied to the accelerating electrode 2 by a high-voltage power-supply 3. Next, the resultant electron beam 14 is converged by a converging electronic lens 4. Moreover, the current amount of the electron beam 14 is adjusted using a diaphragm 5. After that, the electron beam 14 is scanned in a two-dimensional manner by a scanning coil 6. The electron beam 14 is focused by an electronic objective lens that is deployed directly above a semiconductor wafer (which, hereinafter, will be referred to as "wafer" simply) 9, i.e., the sample. Then, the electron beam enters the wafer 9. Finally, secondary electrons 15, which are generated as a result of the primary electrons' having entered the wafer 9, are detected by a secondary-electron detector 7. The amount of the secondary electrons detected reflects the profile of the sample's surface. Accordingly, based on the information on the secondary electrons, it becomes possible to implement the image-formation of the profile of the sample's surface. Here, the inside of a housing 13 is maintained at a high vacuum. The wafer 9, which is held on an electrostatic chuck 10 with a constant planarization degree ensured, is fixed onto an X-Y stage 16. Incidentally, in the present drawing, the housing and its internal structure are illustrated using their cross-sectional view seen from the transverse direction. The X-Y stage 16, the electrostatic chuck 10, and the wafer 9, however, are illustrated using their perspective view so that their operations become easier to image. The electrostatic chuck 10, which is mounted on a Y stage 11 of the X-Y stage 16, is made displaceable in the Y direction. Also, the Y stage 11, which is mounted on an X stage 12, is made displaceable in the X direction. Consequently, the wafer 9 is displaceable freely in both the X direction and the Y direction. This feature makes it possible to measure an arbitrary position within the wafer's surface. Also, three penetration holes 18 are bored into the electrostatic chuck 10 which is supposed to become a sample-supporting stage. This feature makes it possible to displace, in the upward and downward directions, a transporting push-up pin for attaching/detaching the wafer 9 to/from the electrostatic chuck 10. Also, a reference numeral 17 denotes a contact pin which is used for applying the retarding voltage to the wafer 9. This contact pin 17 functions as a contact terminal between a retarding power-supply and the inside of the wafer covered with an insulating film or the like. Also, the scanning electron microscope illustrated in FIG. 5 is controlled by a not-illustrated control apparatus. The electrostatic-chuck mechanism and the retarding-voltage applying power-supply, which will be explained hereinafter, are also controlled by this control apparatus.

Figure 2:
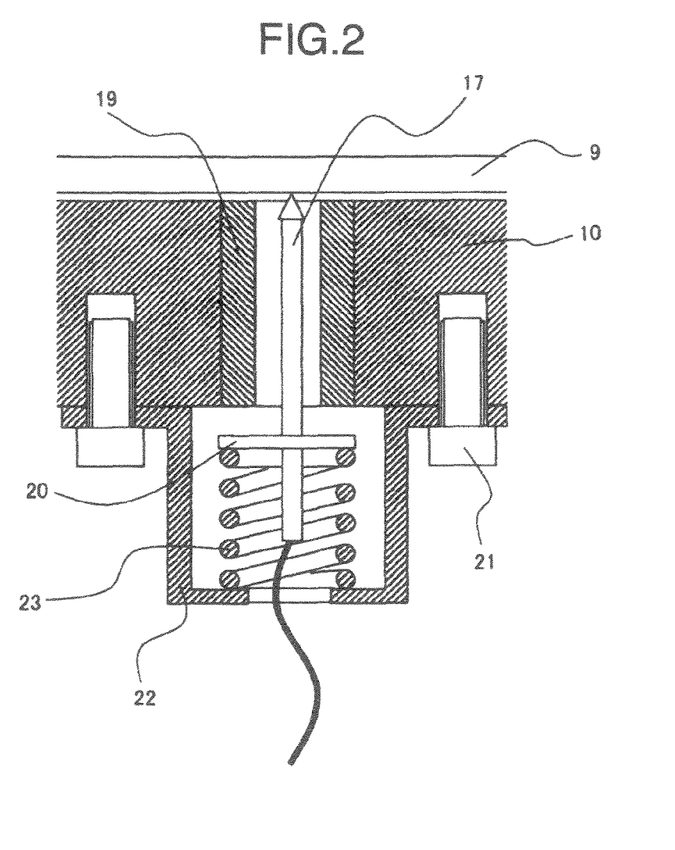
FIG. 2 is a diagram for explaining the overview of a contact pin which is one example of the contact terminal with the sample.

FIG. 2 illustrates the detailed structure of the contact pin 17. A penetration hole is bored into the electrostatic chuck 10. This penetration hole is filled with an insulating pipe 19 in such a manner that the insulating pipe 19 fits this penetration hole. The contact pin 17, whose front-end is formed of an electrically-conductive diamond, is inserted into this insulating pipe 19. A brim 20, which is set up on the under side of the electrostatic chuck including the contact pin, is supported by a coil spring 23 that is contained in a cover 22 fixed to the electrostatic chuck with bolts 21. In this state, the front-end of the contact pin 17 is so configured as to protrude from the surface of the electrostatic chuck 10. Accordingly, it turns out that, when the wafer 9 is mounted on the electrostatic chuck 10 and the contact pin 17, the contact pin 17 is caused to sink down by the self-weight of the wafer 9. Consequently, in the state where the wafer 9 is mounted thereon, the contact pin 17 falls into a state where the contact pin 17 is pressed against the wafer's rear surface by a push-up force of the coil spring 23. This state of the contact pin 17 makes it easier to establish and obtain the electrical conduction between the contact pin and the wafer, even if an insulating film such as an oxide film or nitride film exists on the wafer's rear surface. The proper protruding amount of this contact pin 17 in the state where the wafer 9 is not mounted thereon is determined from a spring constant of the coil spring, and the press-against force of the coil spring which is wished to be given to the contact pin 17. The experiment made by the inventor et al. has shown the following findings: Namely, if the front-end radius of the ground pin falls in a 1-μm to 10-μm range, in an electrical-circuit configuration which will be described later, an about 20-gf to 60-gf press-against force is preferable from the viewpoint of the reproducibility of the electrical conduction and the reduction in the number of the foreign substances. In view of this situation, in the present embodiment, the spring constant of the coil spring is set at 80 gf/mm, and the protruding amount of the contact pin 17 is set at 0.5 mm. Namely, the press-against force becomes equal to 40 gf. For example, the self-weights of 8-inch and 12-inch wafers are equal to 50 gf and 120 gf, respectively. Accordingly, when the wafers are mounted thereon, the contact pin 17 is pushed down by the self-weights of the wafers.

Figure 1:
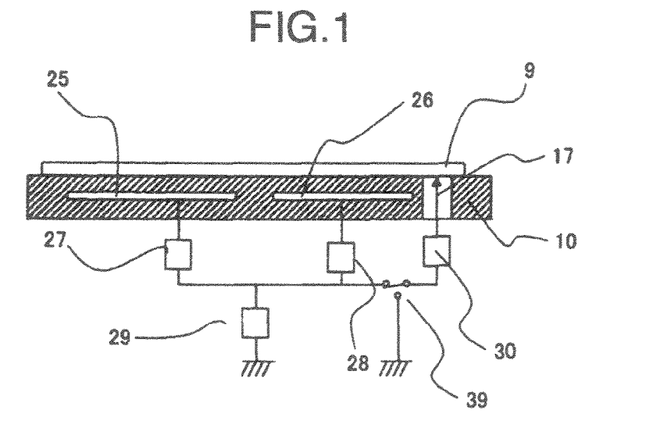
FIG. 1 is a diagram for explaining an example of the sample-holding mechanism including the electrostatic-chuck mechanism and the retarding-voltage applying circuit (first embodiment).

FIG. 1 illustrates a schematic diagram of the electrostatic chuck 10 and the retarding-voltage applying circuit. The electrostatic chuck 10, whose bulk's material is high-resistance alumina, builds-in two internal electrodes 25 and 26 inside. Namely, the electrostatic chuck of the present invention is of the so-called double-pole type. Also, dot-like protrusions, whose diameters are equal to 1 mm or smaller, and whose heights are equal to 20 μm or lower, are provided on the surface of the electrostatic chuck in a 10% or less proportion of the entire projection area. These protrusions are provided in order to prevent the foreign substances from adhering onto the wafer's rear surface. Furthermore, DC power-supplies 27 and 28 are connected to the internal electrodes 25 and 26. These DC power-supplies 27 and 28 are connected to the retarding power-supply 29 for applying the retarding voltage to the wafer 9 in a floating-like manner. Also, as is the case with the DC power-supplies, the contact pin 17 is also connected to the retarding power-supply 29 in a floating-like manner. Also, the front-end of the contact pin is in contact with the wafer 9. A reference numeral 30 denotes a current meter for measuring a leakage current flowing through the contact pin. This meter 30 is so designed as to be able to be monitored using a not-illustrated external monitor.

Figure 3:
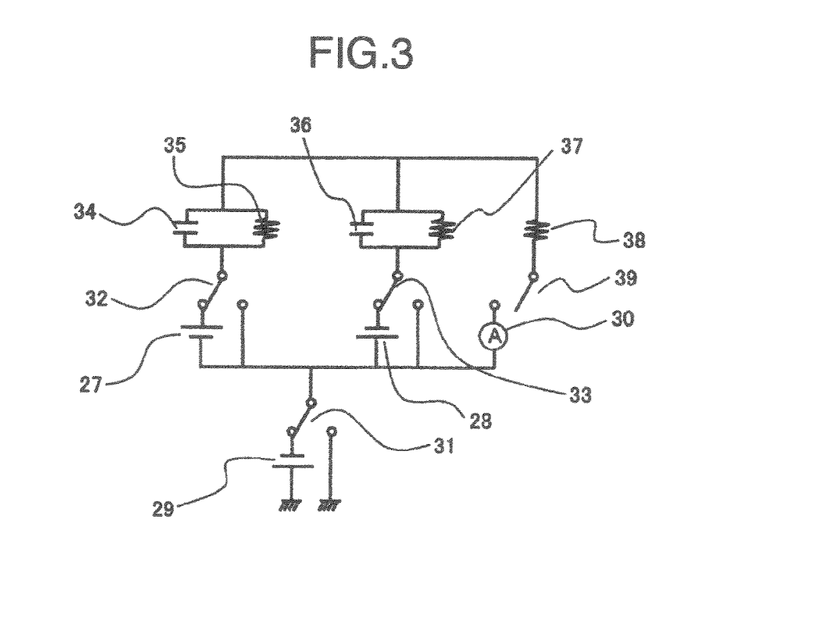
FIG. 3 is a diagram for explaining an equivalent-circuit model to the electrostatic-chuck mechanism and the retarding-voltage applying circuit.
Figure 4:
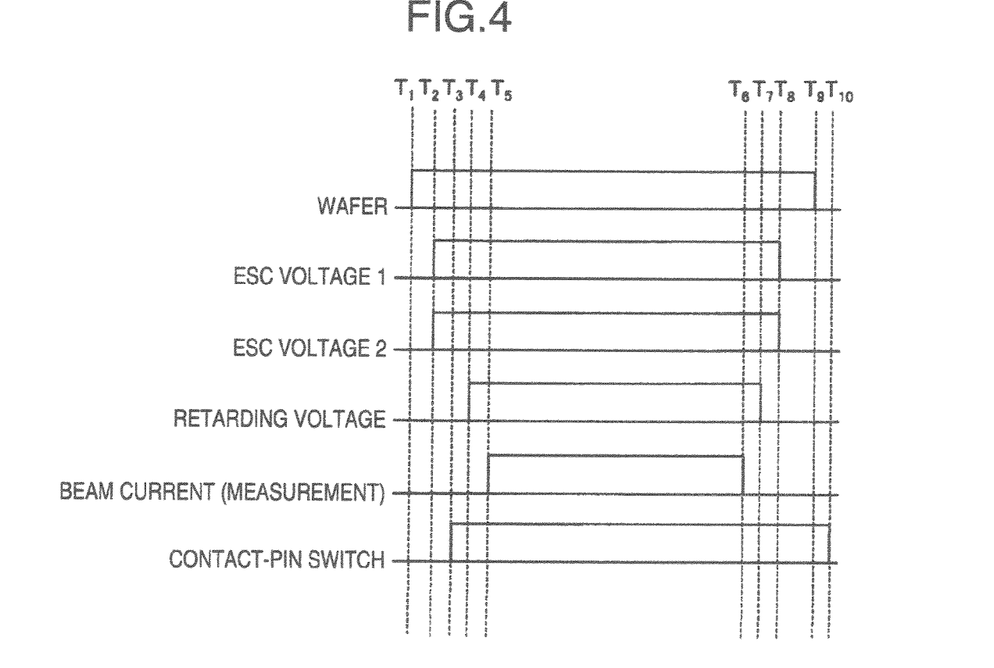
FIG. 4 is a time chart for illustrating voltage-applying timings in the electrostatic-chuck mechanism and the retarding-voltage applying circuit (first embodiment).

FIG. 3 illustrates an equivalent-circuit model to the configuration illustrated in FIG. 1. Also, FIG. 4 illustrates a voltage-applying time chart associated therewith (first embodiment). First, the explanation will be given below concerning electrical components illustrated in FIG. 3. A retarding-power-supply switch 31 is a switch for performing the switching between the retarding power-supply 29 and the ground. DC-power-supply switches 32 and 33 are used for connecting the DC power-supplies to the internal electrodes 25 and 26 of the electrostatic chuck. The equivalent circuit exemplified in FIG. 3 includes therein electrostatic capacitors 34 and 36 of dielectric films of the electrostatic chuck, and resistors 35 and 37 of these dielectric films. Also, the equivalent circuit includes therein a contact resistor 38 of the contact portion between the contact pin and the wafer's rear surface. A retarding-power-supply switch 39 is used for connecting or cutting off the contact pin to/from the ground or the retarding power-supply.

Subsequently, the explanation will be given below regarding the voltage-applying time chart illustrated in FIG. 4. First, at a time $T_1$, the wafer 9 is mounted on the electrostatic chuck 10. This operation brings the wafer into contact with the contact pin 17. At this point-in-time, the retarding-powersupply switch 31 illustrated in FIG. 3 is connected to the ground. Also, the DC-power-supply switches 32 and 33 are switched OFF as well, i.e., the internal electrodes 25 and 26 are grounded as well. A contact-pin switch is in an open state, and thus the wafer is at a floating electric potential now.

At a time $T_2$, the DC-power-supply switches 32 and 33 in FIG. 3 are switched ON simultaneously. This operation applies the DC voltages to the internal electrodes 25 and 26. In the present embodiment, +1020 V and −1000 V are applied to the internal electrode 25 and the internal electrode 26, respectively. As a result, the wafer's electric potential becomes equal to a substantially intermediate electric potential between the voltages applied, i.e., +10 V in the present embodiment.

Next, at a time $T_3$, the retarding-power-supply switch 39 is switched. This operation applies the 10 V voltage between the front-end of the contact pin and the bulk silicon of the wafer. As a result of this voltage application, the leakage current is caused to flow through the circuit. This flow of the leakage current makes it possible to establish the electrical conduction between the contact pin and the silicon with certainty. Also, in the present embodiment, the use of the current meter 30 allows implementation of the measurement on the leakage current which has flown through the circuit at this time, thereby allowing implementation of the monitoring of the electrical-conduction state between the contact pin and the wafer. Also, if, as a result of the monitoring, the electrical conduction has been judged to be insufficient, it is made possible to establish the electrical conduction with certainty by enlarging the difference between the voltages to be applied to the internal electrodes, and switching the contact-pin switch again.

More concretely, the following operation is conceivable: Namely, a certain threshold value is set for the current amount in advance. Then, if the current amount detected by the current meter 30 has not attained this threshold value, or has been found to be smaller than this threshold value, the potential difference between the plurality of internal electrodes is enlarged by the amount of, e.g., a predetermined value. Also, if, even after this enlargement processing is performed, the current amount has not satisfied the predetermined condition, a processing of providing an even larger potential difference is repeated. According to the configuration like this, it becomes possible to apply the retarding voltage after it is confirmed that the electrical conduction has been sufficiently ensured. Also, it is possible to adjust the potential difference in correspondence with the current amount detected by the current meter 30.

Next, at a time $T_4$, the retarding-power-supply switch 31 is switched. This operation applies the retarding voltage to the entire circuit in a floating-like manner.

Subsequently, at a time $T_5$, the measurement is started (i.e., the beam current is applied). After the measurement which continues during a constant time-interval, at a time $T_6$, the measurement is terminated (i.e., the beam current is switched OFF). The beam current, which has entered the wafer's surface during the measurement, flows through to the ground via the retarding power-supply. This condition makes it possible to prevent the wafer from being charged up.

After that, at a time $T_7$, the retarding-power-supply switch is switched to the ground. In this way, at a time $T_8$, the voltage applications to the internal electrodes of the electrostatic chuck are terminated. After that, at a time $T_9$, the wafer is pulled off from the electrostatic chuck by being pushed up therefrom by the ascending operation of a lift pin. Here, since no excessive electric charges remain in the wafer, none of the remaining adsorption is caused to occur. Accordingly, this pull-off-&-peel-off operation is performed smoothly. After that, the contact-pin switch is switched to the ground, thereby cutting off the contact pin from the retarding-voltage applying circuit.

Consequently, in the scanning electron microscopes of the present embodiment, it becomes possible to make the measurement on the wafer's surface while holding the wafer in a planarized manner using the electrostatic chuck, and while maintaining the wafer's electric potential at the retarding voltage with certainty. Furthermore, it becomes possible to transport the wafer smoothly from the electrostatic chuck after the measurement. These features allow the measurement to be made with a high throughput implemented without resulting in the occurrence of an image distortion or a contrast change during the measurement, and with a high resolution implemented without giving rise to the occurrence of damage onto the sample's surface.

As having been explained so far, in the present embodiment, the employment of the contact-pin switch has made it possible to switch whether the circuit of the contact pin is connected to the retarding-voltage applying circuit, or is connected to the ground. The configuration like this, however, is not necessarily required. For example, a circuit configuration is also implementable where the circuit of the contact pin is connected to the retarding-voltage applying circuit all the time.

Moreover, in the time chart of the present embodiment, the 20 V potential difference has been given between the voltages to be applied to the internal electrodes. In addition, this potential difference has been maintained even while the measurement by the beam irradiation is underway. The present embodiment, however, is not necessarily limited thereto. For example, the absolute values of the voltages applied by the two DC power-supplies may be adjusted into one and the same value, so that the potential difference between the voltages to be applied to the internal electrodes becomes equal to zero. Here, this adjustment is made after the electrical conduction by the contact pin has been successfully confirmed.

Also, in the present embodiment, the explanation has been given such that the application of the retarding voltage is performed by switching the retarding-power-supply switch 31. The present embodiment, however, is not necessarily limited thereto. For example, basically the same effects can also be implemented by employing the following method: Namely, the circuit is always connected to the ground via the retarding power-supply. Then, the application of the retarding voltage is adjusted continuously from 0 V to a desired value.

Also, in the present embodiment, the explanation has been given such that the dielectric films of the electrostatic chuck are formed of the high-resistance alumina, and such that the electrostatic chuck is the so-called Coulomb-scheme electrostatic chuck. The present embodiment, however, is not necessarily limited thereto. For example, the electrostatic chuck may also be the so-called Johnson-Rahbeck-type electrostatic chuck, where the specific resistivity of the dielectric films is equal to about $1 \times 10^{12}$ Ωcm or less, and where the leakage current of a-few-μA order flows. Also, the explanation has been given such that the electrostatic chuck is the so-called double-pole-type electrostatic chuck where the two internal electrodes are included. The present embodiment, however, is not necessarily limited thereto. For example, the present embodiment is also applicable to the following case: Namely, when the semiconductor wafer becomes large-sized in the future, the magnitude of the adsorption force will be required to be adjusted on each area basis. Then, for this reason or other, the internal electrodes will be deployed in a larger number. The important point in the present embodiment is as follows: Namely, an potential difference is given between the wafer and the contact pin by causing a difference to occur between the absolute values of the voltages to be applied to the internal electrodes of the electrostatic chuck. This potential difference is given in order to establish the electrical conduction between the contact pin and the sample with certainty.

Accordingly, in the present embodiment, the opposite polarities have been applied such that the applied voltages are set at +1020 V and −1000 V. The opposite polarities, however, are not necessarily required. For example, basically the same effects can also be expected by setting the applied voltages at, e.g., +1200 V and +200 V.

In the present embodiment, the contact pin has been only supported by the coil spring in the simple manner. Accordingly, it is possible to manage the press-against force between the contact pin and the wafer on the basis of the simple structure. Meanwhile, however, there exists none of a factor which, in opposition to the coil spring, constrains the contact pin in the traverse direction. Consequently, it turns out that the contact pin displaces comparatively easily in the diameter's direction of the insulating pipe. As a result, a sliding friction is caused to occur between the contact pin and the wafer in some cases. Accordingly, there exists a possibility that the number of the rear-surface foreign substances will increase. Consequently, in a case where even an exceedingly small increase in the number of the rear-surface foreign substances cannot help being regarded as a problem, it becomes necessary to restrict the displacement of the contact pin in the traverse direction. In view of this situation, the occurrence of the rear-surface foreign substances has been suppressed by reducing the displacement of the contact pin in the traverse direction.

Figure 6:
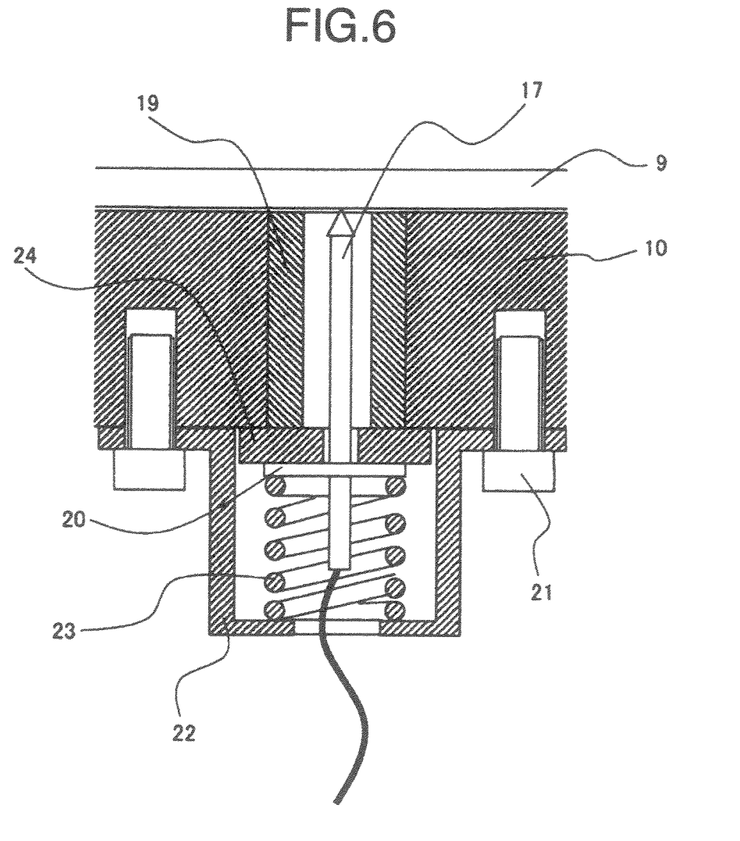
FIG. 6 is a diagram for explaining the overview of the contact pin which is the one example of the contact terminal with the sample (second embodiment).

FIG. 6 illustrates a concrete structure of this contact pin (second embodiment). In the present embodiment, the following configuration is employed: Namely, a spacer 24 is inserted between the back surface of the electrostatic chuck and the brim of the contact pin. In this way, the coil spring is compressed in advance, thereby providing a precompression pressure to the coil spring. In this embodiment, the coil spring is compressed by the amount of 0.3 mm. Accordingly, the protruding amount of the front-end of the contact pin becomes equal to 0.2 mm in this embodiment. This value has turned out to be smaller as compared with the protruding amount of the front-end of the contact pin in the first embodiment, i.e., 0.5 mm. In this configuration, a penetration hole of the spacer 24 suppresses the amount in which the contact pin can displace in the traverse direction essentially. In addition, the precompression pressure is applied to the coil spring. This condition gives rise to the occurrence of a certain extent of press-against force from the point-in-time when the wafer and the contact pin started to come into contact with each other, and when the contact pin started to sink down. This occurrence of the press-against force reduces the sliding friction between the contact pin and the wafer's rear surface. This feature makes it possible to expect the effect of being capable of preventing the undesirable increase in the number of the rear-surface foreign substances.

Also, in the present configuration, by changing the thickness of the spacer, it becomes possible to adjust the protruding amount of the contact pin and the press-against force onto the contact pin against the wafer. Consequently, by setting the protruding amount at a smaller value in advance, it becomes possible to chuck the wafer with certainty by the absorption force of the electrostatic chuck, and to enlarge the press-against force onto the contact pin against the wafer. Here, this adjustment operation is made possible in a case where the press-against force that is larger than the wafer's self-weight is required to be given, and even in a state where merely mounting the wafer on the electrostatic chuck results in the occurrence of a floating of the wafer from the electrostatic chuck's surface. No matter what thickness's insulating film is attached on the wafer, the execution of the adjustment operation like this allows the electrical conduction to be ensured with certainty.

Figure 7:
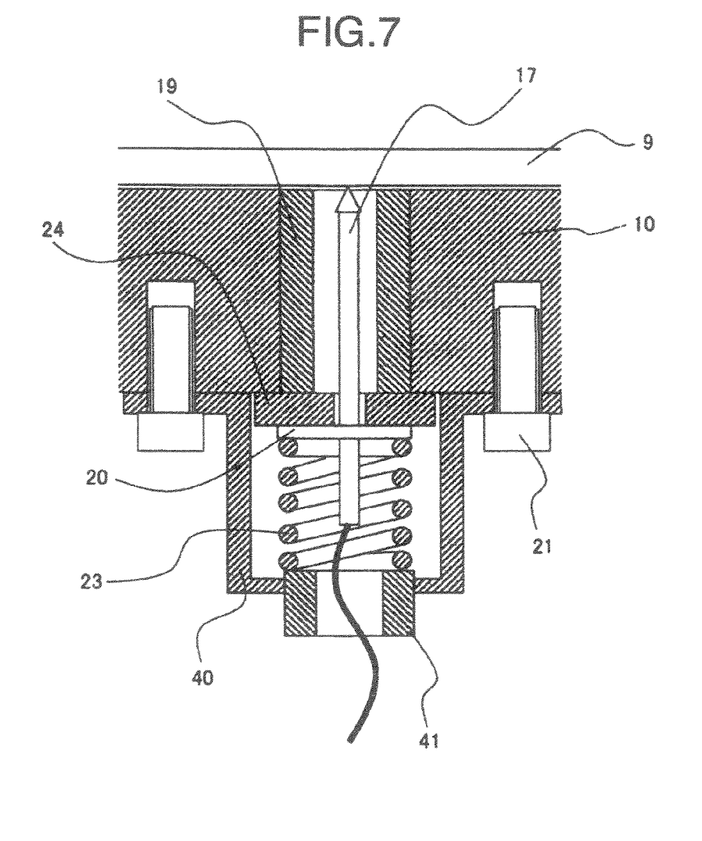
FIG. 7 is a diagram for explaining the overview of the contact pin which is the one example of the contact terminal with the sample (third embodiment).

FIG. 7 illustrates another configuration example of the contact pin (third embodiment). In the present embodiment, the following configuration is employed: Namely, the cover 22 in the configuration illustrated in FIG. 6 is changed to a cover 40 where the penetration-hole portion of the cover 22 is changed to a female screw. Moreover, a compression member 41 is fixed onto the female screw of this cover 40. Here, the compression member 41 has a penetration hole in its center, and has a screw structure which fits the female screw of the cover 40. In this example, by adjusting the screw-in amount of the compression member, it becomes possible to easily adjust the compression amount to be given to the coil spring, i.e., the press-against force onto the contact pin. Accordingly, the employment of this configuration makes it possible to adjust the press-against force onto the contact pin in correspondence with the thickness of the insulating film on the wafer's rear surface, thereby allowing the press-against load to be adjusted in correspondence with the wafer. As a result, it becomes possible to establish the electrical conduction with certainty. Here, this establishment of the electrical conduction is made possible without increasing the number of the rear-surface foreign substances by pressing the contact pin against the wafer with an unnecessarily large press-against load.

In the second and third embodiments of the present invention, it is possible to provide the precompression pressure to the coil spring for supporting the ground pin. It is impossible, however, to adjust the precompression pressure from the outside of the apparatus. This drawback makes it impossible to adjust the press-against load on each wafer basis. As a result, there is a possibility that the following situation will occur: Namely, it is difficult to make the measurement on a wafer whose rear-surface insulating film is thick. Otherwise, the unnecessarily excessive press-against load is given onto the rear-surface insulating film. As a method for avoiding the situation like this, it is conceivable to provide a unit for controlling the press-against force of the coil spring.

Concrete examples of the above-described method are as follows: Namely, a driving mechanism such as a motor is added, thereby rotating, e.g., the compression member in the third embodiment. In this way, the compression member is caused to displace along the female screw of the cover. Also, in substitution for the compression member set up onto the cover in the third embodiment, it is possible to drive the shaft by using the driving mechanism such as a motor in a state where the coil spring is capable of being expanded/contracted. Also, it is possible to drive the displacement of the coil spring in the up-and-down direction by, e.g., combining with each other a piezo device and a mechanism for magnifying the displacement of this piezo device.

The current which flows between the ground pin and the wafer is monitored in accordance with the configuration like this. Moreover, the compression amount of the coil spring is controlled based on a result obtained by this monitoring. The execution of this method allows the electrical conduction to be ensured with the proper press-against load employed in correspondence with the wafer.

In the embodiments explained so far, the ground pin has been supported by the coil spring. These embodiments, however, are not necessarily limited to this configuration alone. Namely, as long as the ground pin is supported by an elastically-supporting member, basically the same effects can also be expected.

Figure 8:
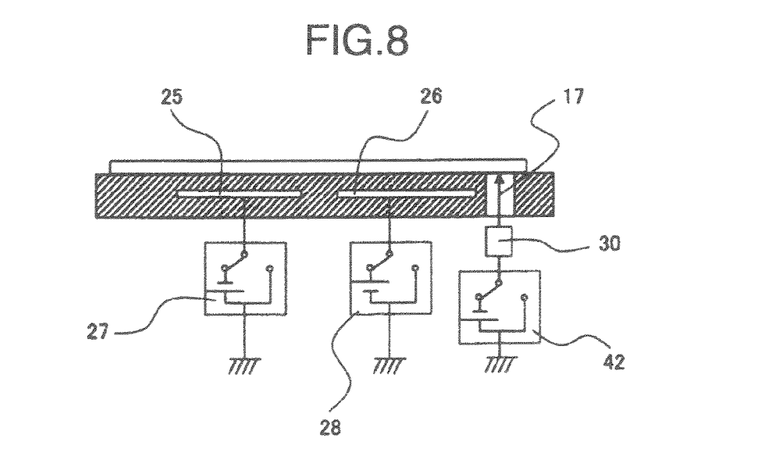
FIG. 8 is a diagram for explaining the equivalent-circuit model to the electrostatic-chuck mechanism and the retarding-voltage applying circuit (fourth embodiment).

FIG. 8 illustrates another configuration example of the CD-SEM where the electrostatic-chuck mechanism and the retarding method are co-used (fourth embodiment). In the present embodiment, unlike the first embodiment, the following configuration is employed: Namely, the retarding power-supply is not connected to the internal electrodes 25 and 26, and only the DC power-supplies 27 and 28 are connected thereto. Meanwhile, a retarding power-supply 42 is connected to the contact pin 17 via the current meter 30. The output from the current meter is so designed as to be able to be monitored using the not-illustrated external monitor.

Figure 9:
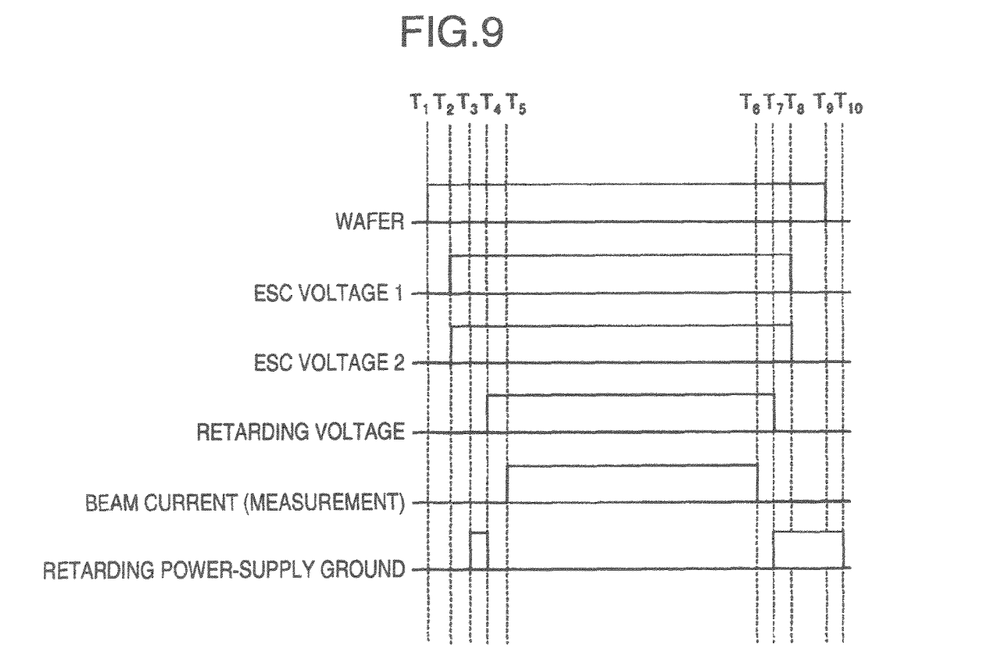
FIG. 9 is a time chart for illustrating voltage-applying timings in the electrostatic-chuck mechanism and the retarding-voltage applying circuit (fourth embodiment).

FIG. 9 illustrates the voltage-applying time chart. First, at a time $T_1$, the wafer is mounted on the electrostatic chuck. This operation brings the wafer into contact with the contact pin. At this point-in-time, the retarding-power-supply switch is switched OFF. The retarding voltage is not applied, and the retarding-power-supply switch is not connected to the ground. Also, the DC-power-supply switches are connected to the ground, and thus the internal electrodes 25 and 26 are grounded.

At a time $T_2$, the DC-power-supply switch are switched and thus the DC power-supplies 27 and 28 are switched ON simultaneously. This operation applies the DC voltages to the internal electrodes 25 and 26. In the present embodiment, +1020 V and −1000 V are applied to the internal electrode 25 and the internal electrode 26, respectively. As a result, the wafer's electric potential becomes equal to a substantially intermediate electric potential between the voltages applied, i.e., +10 V in the present embodiment.

Next, at a time $T_3$, the retarding-power-supply switch 39 is switched to the ground. This operation applies the 10 V voltage between the front-end of the contact pin and the bulk silicon of the wafer. As a result of this voltage application, the leakage current is caused to flow through the circuit. This flow of the leakage current makes it possible to establish the electrical conduction between the contact pin and the silicon with certainty. Also, in the present embodiment, the use of the current meter 30 allows implementation of the measurement on the leakage current which has flown through the circuit at this time, thereby allowing implementation of the monitoring of the electrical-conduction state between the contact pin and the wafer. Also, if, as a result of the monitoring, the electrical conduction has been judged to be insufficient, it is made possible to establish the electrical conduction with certainty by enlarging the difference between the voltages to be applied to the internal electrodes, and switching the contact-pin switch again.

Next, at a time $T_4$, the retarding-power-supply switch is switched. This operation applies the retarding voltage to the wafer. Subsequently, at a time $T_5$, the measurement is started (i.e., the beam current is applied). After the measurement which continues during a constant time-interval, at a time $T_6$, the measurement is terminated (i.e., the beam current is switched OFF). This beam current, which has entered the wafer's surface during the measurement, flows through to the ground via the retarding power-supply. This condition makes it possible to prevent the wafer from being charged up.

After that, at a time $T_7$, the retarding-power-supply switch is switched to the ground. In this way, at a time $T_8$, the voltage applications to the internal electrodes of the electrostatic chuck are terminated. After that, at a time $T_9$, the wafer is pulled off from the electrostatic chuck by being pushed up therefrom by the ascending operation of the lift pin. Here, since no excessive electric charges remain in the wafer, none of the remaining adsorption is caused to occur. Accordingly, this pull-off & peel-off operation is performed smoothly. After that, at a time $T_{10}$, the retarding-power-supply switch is switched OFF, thereby cutting off the contact pin from the retarding-voltage applying circuit.

Consequently, in the scanning electron microscopes of the present embodiment, it becomes possible to make the measurement on the wafer's surface while holding the wafer in a planarized manner using the electrostatic chuck, and while maintaining the wafer's electric potential at the retarding voltage with certainty. Furthermore, it becomes possible to transport the wafer smoothly from the electrostatic chuck after the measurement. These features allow the measurement to be made with a high throughput implemented without resulting in the occurrence of an image distortion or a contrast change during the measurement, and with a high resolution implemented without giving rise to the occurrence of damage onto the sample's surface.

In the present embodiment, the voltages applied to the electrostatic chuck at the time $T_2$ have been not particularly adjusted even after the retarding voltage had been applied at the time $T_3$. It is also possible, however, to adjust these voltages in correspondence with the value of the retarding voltage. Concretely, if, for example, −1000 V had been applied to the wafer as the retarding voltage, it turns out that none of the adsorption force is caused to occur on the internal electrode to which the −1000 V had been applied. In view of this situation, for example, the voltage of the internal electrode to which the +1020 V voltage had been applied is changed to 0 V, and the voltage of the internal electrode to which the −1000 V voltage had been applied is changed to −2000 V. As a result of these voltage changes, the applied voltages as the electrostatic chuck become equal to ±1000 V even while the application of the retarding voltage is still underway. As a consequence, it becomes possible to maintain the adsorption force with an excellent valance implemented.

Figure 10:
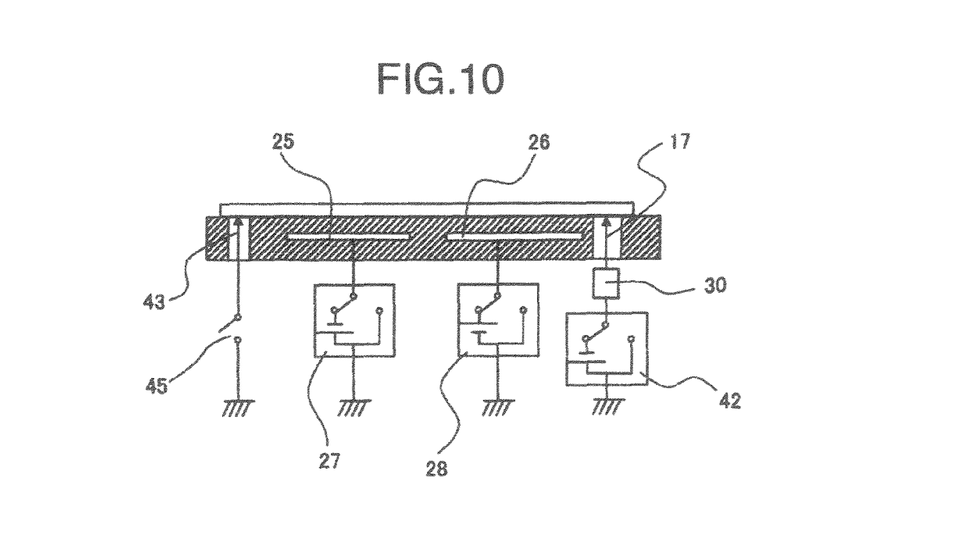
FIG. 10 is a diagram for explaining one example of the circuit configuration diagram of the electrostatic-chuck mechanism and the retarding-voltage applying circuit (fifth embodiment).

FIG. 10 illustrates still another configuration example of the CD-SEM where the electrostatic-chuck mechanism and the retarding method are co-used (fifth embodiment). The configuration employed in the present embodiment is a configuration where a second contact pin 43 is added to the configuration in the fourth embodiment.

A switch 45 is a switch for switching whether the second contact pin 43 is connected to the ground, or is grounded. In the first to fourth embodiments, the voltages are applied to the wafer by taking advantage of the potential difference between the voltages to be applied to the internal electrodes. Accordingly, even if, for example, +1000 V and 0 V are applied to the internal electrodes, the voltages which are applicable to the ground pin and the wafer are maintained at 500 V. Meanwhile in the present scheme, it becomes possible to ensure the electrical conduction by taking advantage of the voltage of the retarding power-supply. Consequently, it becomes possible to provide a larger potential difference, thereby allowing the electrical conduction to be ensured with higher certainty. Also, it is possible to ensure the electrical conduction without taking advantage of the power-supply of the electrostatic chuck. This feature allows the electrical conduction to be ensured even if the electrostatic chuck or the power-supply fails, thereby making it possible to activate the apparatus without operating the electrostatic chuck.

Figure 11:
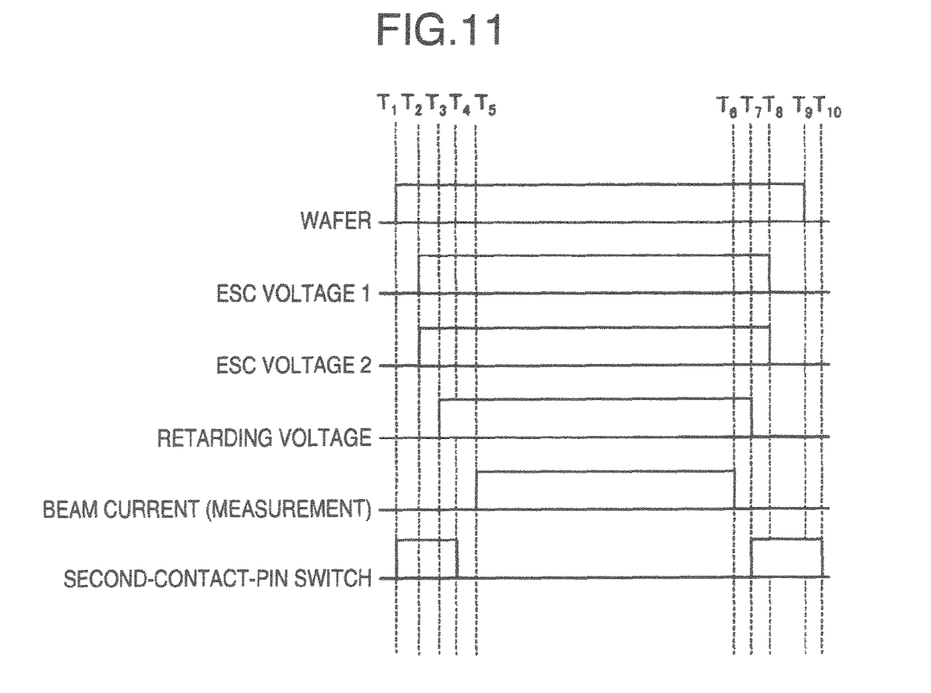
FIG. 11 is a time chart for illustrating voltage-applying timings in the electrostatic-chuck mechanism and the retarding-voltage applying circuit (fifth embodiment).

FIG. 11 illustrates the voltage-applying time chart. First, at a time $T_1$, the wafer is mounted on the electrostatic chuck. This operation brings the wafer into contact with the contact pin. At this point-in-time, the retarding-power-supply switch 39 is connected to the ground. Also, the DC-power-supply of 32 and 33 are connected to the ground, and the internal electrodes 25 and 26 are grounded as well. Meanwhile, the switch 45 of the second contact pin 43 is switched ON, and is connected to the ground.

At a time $T_2$, the DC-power-supply of 32 and 33 are switched, and thus the DC power-supplies 27 and 28 are switched ON simultaneously. This operation applies the DC voltages to the internal electrodes 25 and 26. In the present embodiment, +1020 V and −1000 V are applied to the internal electrode 25 and the internal electrode 26, respectively. As a result, the wafer's electric potential becomes equal to a substantially intermediate electric potential between the voltages applied, i.e., +10 V in the present embodiment. At this point-in-time, in the contact pin and the second contact pin 43, the electrical conduction with the wafer is ensured in many cases. The wafer's electric potential on this occasion becomes equal to 0 V.

Nevertheless, in a wafer whose insulating film's thickness is thick, and to which the present embodiment should be applied, the electrical conduction cannot be ensured in some cases. In the following operation, such an occasion is assumed.

Next, at a time $T_3$, the retarding-power-supply switch 39 is switched ON. This operation applies the retarding voltage from the contact pin to the ground via the second contact pin 43. In the present embodiment, the 100-V retarding voltage is applied. This 100-V retarding voltage is lower than the voltage which is generally employed as the retarding voltage.

As a result of this voltage application, the leakage current is caused to flow through the circuit. This flow of the leakage current makes it possible to establish the electrical conduction between the contact pin and the silicon with certainty. Also, in the present embodiment, the use of the current meter 30 allows implementation of the measurement on the leakage current which has flown through the circuit at this time, thereby allowing implementation of the monitoring of the electrical-conduction state between the contact pin and the wafer. Also, if, as a result of the monitoring, the electrical conduction has been judged to be insufficient, it is made possible to establish the electrical conduction with certainty by enlarging the retarding voltage, and switching the contact-pin switch again.

Next, at a time $T_4$, the second-contact-pin switch for switching the second contact pin is switched OFF, thereby being cut off from the ground. Then, the retarding voltage is set at a value which is needed for the beam measurement.

Subsequently, at a time $T_5$, the measurement is started (i.e., the beam current is applied). After the measurement which continues during a constant time-interval, at a time $T_6$, the measurement is terminated (i.e., the beam current is switched OFF). This beam current, which has entered the wafer's surface during the measurement, flows through to the ground via the retarding power-supply. This condition makes it possible to prevent the wafer from being charged up.

After that, at a time $T_7$, the retarding-power-supply switch and the second-contact-pin switch are switched to the ground. In this way, at a time $T_8$, the voltage applications to the internal electrodes of the electrostatic chuck are terminated. After that, at a time $T_9$, the wafer is pulled off from the electrostatic chuck by being pushed up therefrom by the ascending operation of the lift pin. Here, since no excessive electric charges remain in the wafer, none of the remaining adsorption is caused to occur. Accordingly, this pull-off & peel-off operation is performed smoothly. After that, the retarding-power-supply switch is switched OFF, thereby cutting off the contact pin from the retarding-voltage applying circuit.

Consequently, in the scanning electron microscopes of the present embodiment, it becomes possible to make the measurement on the wafer's surface while holding the wafer in a planarized manner using the electrostatic chuck, and while maintaining the wafer's electric potential at the retarding voltage with certainty. Furthermore, it becomes possible to transport the wafer smoothly from the electrostatic chuck after the measurement. These features allow the measurement to be made with a high throughput implemented without resulting in the occurrence of an image distortion or a contrast change during the measurement, and with a high resolution implemented without giving rise to the occurrence of damage onto the sample's surface.

In the present embodiment, the potential difference between the voltages to be applied to the electrostatic chuck has been given such that these voltages are set at +1020 V and −1000 V. For implementing the maximum utilization of the features in the present embodiment, however, the wafer's electric potential may also be made equal to 0 V by applying voltages whose polarities are opposite to each other, and whose absolute values are one and the same value. Also, in the present embodiment, in addition to the contact pin, the second contact pin is added. The present embodiment, however, is not necessarily limited thereto. Namely, it is also possible to add additional contact pins further. In that case, it becomes possible to establish the electrical conduction with higher certainty implemented. Carelessly enlarging the contact portion associated therewith, however, gives rise to the occurrence of an increase in the number of the rear-surface foreign substances. Accordingly, the number of the contact pins should be arbitrarily determined by taking into consideration the viewpoint of the ease with which the electrical conduction with the wafer can be established and the number of the rear-surface foreign substances. Moreover, the present embodiment is so configured as to ground one end of the power-supplies for applying the voltages to the electrostatic chuck. The present embodiment, however, is not necessarily limited thereto. For example, as is the case with the first embodiment, it is also possible to connect the power-supplies to the retarding power-supply in a floating-like manner.

REFERENCE SIGNS LIST 1 electron source
2 primary-electron accelerating electrode
3 high-voltage power-supply
4 electronic lens
5 diaphragm
6 scanning coil
7 secondary-electron detector
8 electronic objective lens
9 wafer
10 electrostatic chuck
11 Y stage
12 X stage
13 housing
14 electron beam
15 secondary electrons
16 X-Y stage
17 contact pin
18 penetration hole
19 insulating pipe
20 brim
21 bolts
22 cover
23 coil spring
24 spacer 25, 26 internal electrodes
27, 28 DC power-supplies
29, 42 retarding power-supplies
30 current meter
31 retarding-power-supply switch
32, 33 DC-power-supply switch
34, 36 dielectric-film electrostatic capacitors
35, 37 dielectric-film resistors
38 contact resistor
39 retarding-power-supply switch
40 cover
41 compression member
43 second contact pin
44 electrical-conduction power-supply
45 switch

The invention claimed is:

1. A scanning electron microscope for scanning an electron beam on a sample deployed on a sample-supporting stage, said electron beam being emitted from an electron source, said scanning electron microscope, comprising:
a negative-voltage applying power-supply for applying a negative voltage to said sample, and thereby forming a decelerating electric field to be exerted onto said electron beam;
an electrostatic-chuck mechanism for providing a potential difference among a plurality of its internal electrodes, and thereby generating an adsorption force to be exerted onto said sample;
a contact terminal which is so configured as to come into contact with said sample when said sample is deployed on said sample-supporting stage; and
a switch which switches connecting destination of the contact terminal between the negative-voltage applying power-supply and a ground electrode, wherein:
said electrostatic-chuck mechanism causes said potential difference to occur among said internal electrodes in said state where said contact terminal comes into contact with said sample and the contact terminal is connected to the ground electrode, and
said negative-voltage applying power-supply being operated to apply said negative voltage to said contact terminal by switching of the switch after said potential difference has been caused to occur.

2. The scanning electron microscope according to claim 1, further comprising:
a current meter for detecting an electric current which flows through between said contact terminal and said negative-voltage applying power-supply.

3. The scanning electron microscope according to claim 2, wherein
said electrostatic-chuck mechanism is so controlled as to enlarge said potential difference, when said current amount detected by said current meter does not satisfy a predetermined condition.

4. The scanning electron microscope according to claim 1, wherein
said contact terminal is so configured as to be pushed and pressed onto said sample by exertion of an elastic member.

5. The scanning electron microscope according to claim 1, wherein
there are provided two units of said contact terminal which comes into contact with said sample.

6. The scanning electron microscope according to claim 5, wherein,
when a predetermined electric current does not flow through between one of said two contact terminals and said sample,
said negative voltage is applied to said sample from said negative-voltage applying power-supply and from said other contact terminal of said two contact terminals.

7. A scanning electron microscope for measuring surface of a sample using an electron beam while said sample is being held by an electrostatic chuck,
said scanning electron microscope, comprising:
a retarding voltage power-supply for applying a retarding voltage;
an electrostatic-chuck mechanism for providing a potential difference among a plurality of its internal electrodes, and thereby generating an adsorption force to be exerted onto said sample;
a contact pin held by an elastic member such that said contact pin protrudes from surface of said electrostatic chuck; and
a switch which switches connecting destination of the contact pin between the retarding voltage power-supply and a ground electrode, wherein:
said electrostatic chuck applies DC voltage to the plurality of electrodes, absolute values of said DC voltages being different from each other, in a state where the contact pin contacts with the sample and, by switching of the switch, the contact pin is connected to the ground electrode, and
a retarding voltage being applied to said contact pin, after said DC voltage is applied, absolute values of said DC voltages being different from each other, by switching of the switch.

8. A sample-holding method used for a scanning electron microscope for measuring surface of a sample using an electron beam while said sample is being held by an electrostatic chuck which comprises a plurality of electrodes inside,
said sample-holding method, comprising the steps of:
bringing said sample into contact with a contact pin and connecting the contact pin to a ground electrode, said contact pin being held by an elastic member such that said contact pin protrudes from surface of said electrostatic chuck;
applying DC voltages to said plurality of internal electrodes of said electrostatic chuck in a state where the contact pin contacts with the sample and the contact pin is connected to the ground electrode, absolute values of said DC voltages being different from each other; and
applying a retarding voltage to at least said contact pin after said DC voltage is applied by switching of the switch, absolute values of said DC voltages being different from each other.

9. A scanning electron microscope for measuring surface of a sample using an electron beam while said sample is being held by an electrostatic chuck,
said scanning electron microscope, comprising:
a retarding voltage power-supply for applying a retarding voltage;
an electrostatic-chuck mechanism for providing a potential difference among a plurality of its internal electrodes, and thereby generating an adsorption force to be exerted onto said sample;
at least two contact pins held by an elastic member such that said at least two contact pins protrude from surface of said electrostatic chuck;

a first switch which switches connecting destination of one of the at least two contact pins between the retarding voltage power-supply and a ground electrode; and a second switch which connects other contact pin of the at least two contact pins to the ground electrode or disconnects the other contact pin of the at least two contact pins from the ground electrode, wherein:

said electrostatic chuck causes a potential difference to occur among said internal electrodes in a state where said at least two contact pins comes into contact with said sample and the other contact pin is connected to the ground electrode by switching of the second switch, and, said retarding voltage power-supply being operated to apply the retarding voltage to said one of said at least two contact pins by switching of the first switch after the potential difference has occurred, and said second switch being operated to disconnect said other contact pin from said ground electrode after the retarding voltage has been applied to said one contact pin.

10. A sample-holding method used for a scanning electron microscope for measuring surface of a sample using an electron beam while said sample is being held by an electrostatic chuck which comprises a plurality of electrodes in its inside, said sample-holding method, comprising the steps of:

bringing said sample into contact with at least two contact pins before said sample is irradiated with said electron beam, said contact pins being held by an elastic member such that said contact pins protrude from surface of said electrostatic chuck;

causing a potential difference to occur among said internal electrodes in a state where one of said at least two contact pins is connected to a ground electrode by switching of a first switch which is connected to the one contact pin and switches connection of the one contact pin between a retarding voltage power-supply and the ground electrode, and other of at least two contact pins is connected to the ground electrode by switching of a second switch which is connected to said other contact pin and connects said other contact pin to the ground electrode or disconnect said other contact pin from the ground electrode;

switching the first switch to apply the retarding voltage to the one contact pin after the potential difference has occurred; and switching the second switch to disconnect the other contact pin from the ground electrode after the retarding voltage has been applied to the one contact pin.

* * * * *